United States Patent
Jenninger et al.

(10) Patent No.: US 8,779,650 B2
(45) Date of Patent: Jul. 15, 2014

(54) PROCESS FOR THE PRODUCING OF AN ELECTROMECHANICAL TRANSDUCER

(75) Inventors: Werner Jenninger, Köln (DE); Joachim Wagner, Köln (DE); Wolfgang Fischer, Meerbusch (DE); Jörg Büchner, Bergisch Gladbach (DE); Thomas Bernert, Oberbillig (DE); Andreas Nübler, Leverkusen (DE)

(73) Assignee: Bayer MaterialScience AG, Leverkusen (DE)

( * ) Notice: Subject to any disclaimer, the term of this patent is extended or adjusted under 35 U.S.C. 154(b) by 200 days.

(21) Appl. No.: 13/258,646
(22) PCT Filed: Apr. 10, 2010
(86) PCT No.: PCT/EP2010/002238
§ 371 (c)(1), (2), (4) Date: Dec. 13, 2011
(87) PCT Pub. No.: WO2010/121720
PCT Pub. Date: Oct. 28, 2010

(65) Prior Publication Data
US 2012/0068572 A1 Mar. 22, 2012

(30) Foreign Application Priority Data
Apr. 24, 2009 (EP) .................................. 09005740

(51) Int. Cl.
H01L 41/09 (2006.01)
H01L 41/16 (2006.01)
H01L 41/22 (2013.01)
H01L 41/45 (2013.01)
H01L 41/193 (2006.01)
H01L 41/083 (2006.01)
H01L 41/277 (2013.01)
H04R 17/00 (2006.01)

(52) U.S. Cl.
CPC ............. *H01L 41/45* (2013.01); *H01L 41/083* (2013.01); *H01L 41/277* (2013.01); *H04R 17/005* (2013.01); *H01L 41/193* (2013.01); *Y10S 310/80* (2013.01)

USPC .................. 310/328; 310/800; 29/25.35

(58) Field of Classification Search
USPC .................. 310/328, 334, 800; 29/25.35
See application file for complete search history.

(56) References Cited

U.S. PATENT DOCUMENTS 4,628,573 A * 12/1986 Hamada et al. ............. 29/25.35
6,758,094 B2 * 7/2004 Miller ............................. 73/632

(Continued)

FOREIGN PATENT DOCUMENTS

GB 2 243 946 A * 11/1991 .............. H01L 41/22

OTHER PUBLICATIONS

Basso et al, Three-layer Ferroelectrets from Perforated Teflon®-PTFE Films Fused between Two Homogeneous Teflon®-FEP Films, 2007 Annual Report Conference on Electrical Insulation and Dielectric Phenomena, 1-4244-1482-2/07, IEEE, pp. 453-456.

(Continued)

*Primary Examiner* — Thomas Dougherty
(74) *Attorney, Agent, or Firm* — John E. Mrozinski, Jr.

(57) ABSTRACT

The present invention relates to a method for producing an electromechanical, for example piezoelectric, transducer in which a first polymer layer comprising cutouts is applied to a first continuous polymer layer by means of a printing and/or coating method, a cover is applied to the first polymer layer comprising cutouts in such a way that the cutouts of the first polymer layer comprising cutouts are closed off with the formation of cavities, and the cover is connected to the first polymer layer comprising cutouts. The invention also relates to electromechanical transducers produced by the method according to the invention, and the use of said electromechanical transducers.

22 Claims, 7 Drawing Sheets

(56) References Cited

U.S. PATENT DOCUMENTS

| | | | |
|---|---|---|---|
| 7,193,350 B1* | 3/2007 | Blackburn et al. | 310/311 |
| 7,791,253 B2* | 9/2010 | Bhardwaj | 310/334 |
| 2004/0032188 A1* | 2/2004 | Bhardwaj | 310/334 |
| 2011/0109200 A1* | 5/2011 | Jenninger et al. | 310/338 |
| 2011/0284657 A1* | 11/2011 | Andrews et al. | 239/102.2 |

OTHER PUBLICATIONS

Huang et al, Piezoelectrets from Laminated Sandwiches of Porous Polytetrafluoroethylene Films and Nonporous Fluoroethylenepropylene Films, Journal of Applied Physics, 103, pp. 084111-1-084111-6, 2008, American Institute of Physics.

Saarimäki et al, Novel Heat Durable Electromechanical Film: Processing for Electromechanical and Electret Applications, IEEE Transactions on Dielectrics and Electrical Insulation, vol. 13, No. 5, pp. 963-972, Oct. 2006.

* cited by examiner

PROCESS FOR THE PRODUCING OF AN ELECTROMECHANICAL TRANSDUCER

FIELD OF THE INVENTION

The present invention relates to a process for the production of an electromechanical, for example piezoelectric, converter, to electromechanical converters, and to the use thereof.

BACKGROUND OF THE INVENTION

The ability of some materials to generate an electric potential in response to applied mechanical stress is referred to as piezoelectricity. Established piezoelectric materials are lead zirconium titanate (PZT) and fluorinated polymers such as polyvinylidene fluoride (PVDF). Piezoelectric behaviour has also been observed in foamed, closed-pore polypropylene (PP). In order to achieve piezoelectricity, such a polypropylene foam is charged in a high electric field. As a result, electrical breakdowns occur within the pores, generating macrodipoles and polarising the material macroscopically. Such polypropylene ferroelectrets can have a piezoelectric coefficient of several hundred picocoulombs per Newton. In order further to increase the sensitivity of the sensor action, multilayer systems comprising a plurality of foams stacked one above the other have been developed.

Gerhard et al. (2007 Annual Report Conference on Electrical Insulation and Dielectric Phenomena, pages 453 to 456) describe a three-layer ferroelectret in which a polytetrafluoroethylene film provided with a plurality of homogeneous through-holes by mechanical or laser-based drilling is arranged between two homogeneous fluoroethylenepropylene films. However, the incorporation of through-holes by mechanical or laser-based drilling is complex and unsuitable for large-scale production. For example, as is also disclosed in the above-mentioned source (p. 454), the perforated layer must be chemically cleaned after the mechanical or laser-based drilling in order to remove metal residues (burrs) or organic residues.

The three-layer ferroelectret disclosed in Gerhard et al. is produced by a lamination process. In this process, the polytetrafluoroethylene film provided with holes is joined to the fluoroethylenepropylene films by passing the layers between two heated rotating cylinders under high pressure and at elevated temperature (310° C.).

It would be desirable to provide a process for the production of an electromechanical, for example piezoelectric, converter that is suitable for large-scale production.

DETAILED DESCRIPTION OF THE INVENTION

There is therefore proposed according to the invention a process for the production of an electromechanical, for example piezoelectric, converter, which process comprises the following steps:
A) applying a first polymer layer (2; 2a) having holes (3; 3a) to a first continuous polymer layer (1; 1a) by means of a printing and/or coating process, with the exception of a lamination process;
B) applying a covering (4; 1b, 2b) to the first polymer layer (2; 2a) having holes (3; 3a) so that the holes (3; 3a) of the first polymer layer (2; 2a) having holes (3; 3a) are closed to form voids (5); and
C) joining the covering (4; 1b, 2b) to the first polymer layer (2; 2a) having holes (3; 3a), wherein
in a process step D), an electrode (6a) is applied to the outside of the first continuous polymer layer (1, 1a) and an electrode (6b) is applied to the outside of the covering (4; 1b, 2b), the electrodes (6a, 6b) being applied independently of one another or simultaneously before or after one of steps A) to C), and
in a process step E), the arrangement obtained after process step C) or after a process step following process step C) is charged.

By means of the process according to the invention, electromechanical converters can advantageously be produced on a large scale.

Within the scope of the invention, coating processes are understood in particular as being not laminating processes as are disclosed, for example, in Gerhard et al.

Furthermore, the holes can have many different shapes in the process according to the invention. The shape of the hole is therefore not limited to a cylindrical shape with a circular cross-sectional area. Moreover, the process according to the invention offers the possibility of combining holes of different shapes. In this manner it is advantageously possible on the one hand to maximise the total void volume of the resulting voids. On the other hand, the electromechanical, in particular piezoelectric, properties of the electromechanical converters produced by the process according to the invention can be adjusted by the choice of hole shape, arrangement and/or distribution.

In addition, burrs and other sharp-edged hole surface irregularities are avoided by the process according to the invention. On the one hand this has an advantageous effect on the electromechanical, in particular piezoelectric, properties; on the other hand it reduces the outlay in the production of the converter because the working step of removing such irregularities is unnecessary.

The polymer layer having holes can advantageously make the electromechanical converter that is to be produced softer along its thickness, thus lowering its modulus of elasticity, permitting a polarisation process in the resulting voids and/or separating load layers formed in the continuous polymer layers after the charging process.

In an embodiment of the process, the covering comprises a second polymer layer having holes and a second continuous polymer layer, the second polymer layer having holes being arranged on the second continuous polymer layer. In particular, the covering can consist of a second polymer layer having holes and a second continuous polymer layer.

In a further embodiment of the process, the covering is a third continuous polymer layer.

In a further embodiment of the process, the covering is produced by applying a second polymer layer having holes to a second continuous polymer layer by means of a printing and/or coating process.

The material of the first polymer layer having holes can be partially hardened, for example partially dried and/or partially crosslinked and/or partially solidified and/or partially crystallised, after it has been applied to the first continuous polymer layer. Likewise, the material of the second polymer layer having holes can be partially hardened, for example partially dried and/or partially crosslinked and/or partially solidified and/or partially crystallised, after it has been applied to the second continuous polymer layer. In particular, the material of the first polymer layer having holes, after it has been applied to the first continuous polymer layer, and/or the material of the second polymer layer having holes, after it has been applied to the second continuous polymer layer, can be partially hardened, for example partially dried and/or partially crosslinked and/or partially solidified and/or partially crystallised, in such a manner that its viscosity is increased as compared with its viscosity on application to the continuous polymer layer. In this manner, the dimensional stability of the holes can be improved on the one hand. On the other hand, only partial hardening offers the possibility of joining the first polymer layer having holes to the third continuous polymer layer or to the second polymer layer having holes, by further, in particular complete, hardening of the material.

In a further embodiment of the process, therefore, joining of the first polymer layer having holes to the covering is effected by only partial hardening of the material of the first polymer layer having holes, after it has been applied to the first continuous polymer layer, and/or only partial hardening of the material of the second polymer layer having holes, after it has been applied to the second continuous polymer layer, and further, in particular complete, hardening of the material of the first polymer layer having holes after the covering has been applied, and/or further, in particular complete, hardening of the material of the second polymer layer having holes after the covering has been applied. Hardening can here be understood as meaning drying and/or crosslinking and/or solidification and/or crystallisation.

For example, it is possible to dry, for example thermally, the material of the first polymer layer having holes, after it has been applied to the first continuous polymer layer, and/or the material of the second polymer layer having holes, after it has been applied to the second continuous polymer layer, and to carry out crosslinking only after the covering has been applied.

A further example is to use a material that solidifies and/or crystallises amorphously, in particular a polymer, for example a polyurethane, for the first polymer layer having holes and/or the second polymer layer having holes. The material that solidifies and/or crystallises amorphously can be applied, for example, in the form of a dispersion to the first or second continuous polymer layer to form the first or second polymer layer having holes. The material that solidifies and/or crystallises amorphously can partially solidify and/or crystallise amorphously, for example, after being applied to the first or second continuous polymer layer, and can completely solidify and/or crystallise amorphously after the covering has been applied and thereby join the first polymer layer having holes to the covering. The material that solidifies and/or crystallises amorphously can, however, also completely solidify and/or crystallise amorphously after being applied to the first or second continuous polymer layer and be crosslinked after the covering has been applied, the first polymer layer having holes being joined to the covering. Furthermore, the material that solidifies and/or crystallises amorphously can completely solidify and/or crystallise amorphously after being applied to the first or second continuous polymer layer and, after the covering has been applied, can be heated to a temperature at which the material that solidifies and/or crystallises amorphously softens and/or melts, the third continuous polymer layer, or the other polymer layer having holes, being wetted, the structure of the polymer layer having holes being retained and, after cooling to a lower temperature, the first polymer layer having holes being joined to the covering.

The material of the first and/or second polymer layer having holes can be crosslinked, for example, thermally, by irradiation with ultraviolet light, by irradiation with infrared light and/or by drying. In particular, when a layer comprises polymers having low UV stability, such as polycarbonates, crosslinking can take place thermally, by irradiation with infrared light or by drying.

In a further embodiment of the process, application of the first polymer layer having holes and/or application of the second polymer layer having holes takes place by the following coating or printing processes: application by doctor blade, spin coating, dip coating, spray coating, curtain coating, slot-die coating, flexographic printing, gravure printing, tampon printing, digital printing, thermal transfer printing, porous printing, in particular relief printing, flat printing, offset printing and/or screen printing, and/or a roller application process, for example using roller applicators for hot-melt adhesives from Hardo Maschinenbau GmbH (Bad Salzuflen, Germany).

Application of the first polymer layer having holes and/or application of the second polymer layer having holes can be carried out, for example, by application by doctor blade, spin coating, dip coating, spray coating and/or curtain coating in combination with matrices or templates.

In a further embodiment of the process, application of the first polymer layer having holes and/or application of the second polymer layer having holes is carried out by means of a screen printing process.

Application of the first polymer layer having holes and/or application of the second polymer layer having holes can be carried out using a heated, for example electrically heated, screen, in particular a screen printing fabric. Heated screens for screen printing are supplied, for example, by Koenen GmbH (Ottobrunn, Germany) under the trade name Hot Screen.

As screen printing pastes for heated screens there can be used, for example, thermoplastic substances, such as reactive and non-reactive hot-melt adhesives based on polyurethane, polyester and/or polyamide, in particular hot-melt pastes, or screen printing pastes that comprise high-boiling solvents and/or that dry under ultraviolet light.

The thermoplastic substances, or hot-melt pastes, are preferably solid at room temperature and, at the temperatures to which the screen is heated, for example from $\geq 60°$ C. to $\leq 80°$ C., reach a viscosity that is comparable with that of conventional screen printing pastes, for example from $\geq 1000$ mPa·s to $\leq 20,000$ mPa·s. The addition of solvents is not necessary with such hot-melt pastes. The thermoplastic substances cool on contact with the continuous polymer layer and can thus remain sharp-contoured. In addition to sharp-contoured structures, the use of a heated screen and a thermoplastic substance has the advantage that a drying process can be omitted.

Screen printing pastes that comprise high-boiling solvents and/or that dry under ultraviolet light can be applied using a heated screen, in particular a screen printing fabric, and optionally a heated doctor blade. Heating the screen lowers the viscosity of the paste. When the paste comes into contact with the continuous polymer layer, the paste cools and its viscosity increases. This has the advantage that the contour sharpness can be increased. Depending on the fineness of the screen printing fabric, low viscosity pastes can optionally also be used. The fineness of the fabric is understood as meaning the number of threads per centimeter. For example, screen printing fabrics having a thread count of at least 120 threads per centimeter, in particular at least 150 threads per centimeter, can be used.

In order to prevent the paste from cooling on printing when a heated screen is used, and in order to achieve optimum processability during printing, the printing blade and/or flood coater can be heated.

In order to increase the thickness of the polymer layers having holes, a plurality of prints can be executed one above the other. The material of the first or second polymer layer having holes can be partially or completely hardened, for example dried and/or crosslinked and/or solidified and/or crystallised, between the individual printing steps. The prints can optionally be executed wet-on-wet.

While the structure of the polymer layer having holes can be applied directly by a printing process, the positions of the later holes in the above-described coating processes are initially covered or masked.

In a further embodiment of the process, application of the first polymer layer having holes and/or application of the second polymer layer having holes is carried out by transfer coating. "Transfer coating" is understood as meaning in particular that the polymer layer having holes is first formed on a transfer layer, for example a release paper or release film, by a printing and/or coating process and is then transferred to the continuous polymer layer and joined to the continuous polymer layer. Suitable printing and/or coating processes are the above-mentioned printing and/or coating processes. For joining to the continuous polymer layer there are suitable, for example, the above-mentioned procedures based on first only partial and then further, in particular complete, hardening and the above-mentioned lamination process. Transfer coating advantageously provides the possibility of spatially and temporally separating the production of the first and/or second polymer layer having holes and the joining of the layer(s) having holes to the continuous layers.

In a further embodiment of the process, the holes of the first polymer layer having holes pass right through the first polymer layer having holes, in particular in the direction of the continuous polymer layers, and/or the holes of the second polymer layer having holes pass right through the second polymer layer having holes, in particular in the direction of the continuous polymer layers. In this manner, the voids formed on completion of the process according to the invention are in contact on one side with one (first) continuous polymer layer and on the other side with the other (second or third) continuous polymer layer. This in turn has an advantageous effect on the electromechanical behaviour of the electromechanical energy converter that is produced.

Within the scope of the present invention, the first and/or second polymer layer having holes can be formed either by printing and/or coating the first or second continuous polymer layer with a contiguous polymer layer having holes or by printing and/or coating the first or second continuous polymer layer with identical or different, isolated or interconnected structures, for example structures having a small surface area, such as points and lines, for example curved or straight, individual or crossed lines or circumferential lines of geometric figures, for example a circular line or a circumferential line of a cross, or structures having a larger surface area, such as filled rectangles, circles, crosses, etc. The size and layer thickness of the structures is preferably such that the continuous polymer layers cannot touch one another and/or the total void volume obtained after manufacture is as large as possible. In the electromechanical converter, the first and/or second polymer layers having holes can each have a layer thickness of, for example, from $\geq 1$ µm to $\leq 800$ µm, in particular from $\geq 10$ µm to $\leq 400$ µm. If only a first polymer layer having holes is applied during production of the electromechanical converter, then the first polymer layer having holes in the electromechanical converter can have in particular a layer thickness of from $\geq 1$ µm to $\geq 800$ µm, for example from $\geq 10$ µm to $\leq 400$ µm. If both a first and a second polymer layer having holes is applied during production of the electromechanical converter, then the overall layer thickness of the first polymer layer having holes and the second polymer layer having holes in the electromechanical converter can be from $\geq 1$ µm to $\leq 800$ µm, for example from $\geq 10$ µm to $\leq 400$ µm. Depending on the printing and/or coating processes and parameters used in the production of the electromechanical converter, it is possible—for example when using solvent-containing printing inks, inks, pastes, formulations, lacquers or adhesives—for the layer thickness of the first and/or second polymer layer having holes, directly after application of the polymer layer having holes to the continuous layer, to be greater than or even markedly greater than the layer thickness of the resulting polymer layer having holes in the electromechanical converter. The layout, the printing process parameters and/or the coating process parameters are preferably such that the polymer layers having holes do not have any voids, in particular gas inclusions, that are not in contact with the continuous polymer layers.

The holes of the first polymer layer having holes and the holes of the second polymer layer having holes can be so formed and arranged that, when the covering is applied, at least some of the holes of the first polymer layer having holes and some of the holes of the second polymer layer having holes overlap partly or completely.

In a further embodiment of the process, the holes of the first polymer layer having holes and the holes of the second polymer layer having holes are so formed and arranged that, when the covering is applied, a hole of the first polymer layer having holes and a hole of the second polymer layer having holes overlap partly or completely. This means that the holes of the first polymer layer having holes and the holes of the second polymer layer having holes are preferably so formed and arranged that, when the covering is applied, a hole of the first polymer layer having holes and a hole of the second polymer layer having holes form a common void. The holes of the first polymer layer having holes and the holes of the second polymer layer having holes are preferably so formed and arranged that a hole of the first polymer layer having holes and a hole of the second polymer layer having holes overlap completely. For example, the first and second polymer layers having holes can be congruent, in particular identical. It is thus possible to produce voids which are continuous from the continuous polymer layer on one side to the continuous polymer layer on the other side.

Within the scope of the present invention, at least some of the holes of the first polymer layer having holes and/or some of the holes of the second polymer layer having holes can have shapes having a cross-sectional area selected from the group consisting of substantially round, for example circular, elliptical or oval, polygonal, for example triangular, rectangular, trapezoidal, rhombic, pentagonal, hexagonal, in particular honeycomb, cross-shaped, star-shaped and partially round and partially polygonal, for example S-shaped, cross-sectional areas. However, it is also possible for all the holes of the first polymer layer having holes and/or all the holes of the second polymer layer having holes to have shapes having a cross-sectional area selected from the group consisting of substantially round, for example circular, elliptical or oval, polygonal, for example triangular, rectangular, trapezoidal, rhombic, pentagonal, hexagonal, in particular honeycomb, cross-shaped, star-shaped and partially round and partially polygonal, for example S-shaped, cross-sectional areas, as well as shapes differing therefrom.

Within the scope of a further embodiment of the process, the holes of the first polymer layer having holes and/or the holes of the second polymer layer having holes are shaped and/or arranged in a honeycomb. A honeycomb shape and arrangement of the holes results on the one hand in a very large total void volume. On the other hand, a honeycomb shape and arrangement of the holes can have high mechanical stability.

The size of the cross-sectional areas can be the same or different in all the holes of a polymer layer having holes.

Within the scope of the process according to the invention, the holes in the first and/or second polymer layer having holes can be distributed both homogeneously and heterogeneously. In particular, the holes in the first and/or second polymer layer having holes can be distributed homogeneously. Depending on the field of application of the electromechanical converter that is to be produced, however, it can also be advantageous to distribute the holes in the first and/or second polymer layer having holes, in particular purposively, heterogeneously in a space-resolved manner.

The holes in the first and/or second polymer layer having holes can optionally be partially or completely interconnected.

In a further embodiment of the process, the first polymer layer having holes and/or the second polymer layer having holes comprises holes of different shapes. In particular, the first and/or second polymer layer having holes can have a plurality of holes of a first shape and a plurality of holes of a second shape and optionally a plurality of holes of a third shape, etc. The holes of different shapes in the first or second polymer layer having holes can be distributed homogeneously or heterogeneously and/or can be partially or completely interconnected. A combination of holes of different shapes on the one hand advantageously enables the total void volume of the resulting voids to be maximised. On the other hand, the electromechanical, in particular piezoelectric, properties of the electromechanical converters produced by the process according to the invention can be adjusted by the choice of hole shape, arrangement and/or distribution.

In particular, at least some of the holes of the first and/or second layer having holes can have shapes that do not have a circular, in particular a substantially circular, cross-sectional area. The reason for this is that the total void volume of layers that comprise solely voids having circular or substantially circular cross-sectional areas is smaller than the total void volume in, for example, a homogeneously distributed arrangement of voids having circular and rhombic cross-sectional areas or in an arrangement based solely on voids having honeycomb cross-sectional areas.

The first and second polymer layers having holes can in principle be formed, independently of one another, from any polymer that is suitable for permitting a polarisation process in the voids and separating the charge layers formed in the polymer films after the charging process. For example, the polymer layers having holes can be formed from an elastomer.

A printing ink, an ink, a paste, a formulation, a lacquer or an adhesive can be used to apply the first and/or second polymer layer having holes or to form the first and/or second polymer layer having holes. These can either be formulated immediately before processing or can be available commercially.

For example, the printing ink, ink, paste, formulation, lacquer or adhesive, or the first and/or second polymer layer having holes, can comprise or be formed from at least one polymer selected from the group consisting of cellulose esters, cellulose ethers, rubber derivatives, polyester resins, unsaturated polyesters, alkyd resins, phenolic resins, amino resins, amido resins, ketone resins, xylene-formaldehyde resins, epoxy resins, phenoxy resins, polyolefins, polyvinyl chloride, polyvinyl esters, polyvinyl alcohols, polyvinyl acetals, polyvinyl ethers, polyacrylates, polymethacrylates, polystyrenes, polycarbonates, polyesters, copolyesters, polyamides, silicone resins, polyurethanes, in particular polyurethanes, and mixtures of these polymers, in particular in the form of binders. If the printing ink, ink, paste, formulation, lacquer or adhesive, or the first and/or second polymer layer having holes, comprises a resin, the printing ink, ink, paste, formulation, lacquer or adhesive, or the first and/or second polymer layer having holes, can optionally further comprise one or more resin hardeners.

A large number of commercially available products can further be suitable, in particular as binders, for the printing ink, ink, paste, formulation, lacquer or adhesive, or the first and/or second polymer layer having holes, which products are marketed, for example, under the trade names Noriphan HTR, Noriphan PCI, Noriphan N2K, Noricryl and NoriPET by Pröll KG, Weißenburg in Bayern, Germany, or under the trade name Maraflex FX by Marabu GmbH & Co. KG, Tamm, Germany, or under the trade name Polyplast PY by Fujifilm Sericol Deutschland GmbH, Bottrop, Germany, or under the trade names screen printing inks HG, SG, CP, CX, PK, J, TL and YN by Coates Screen Inks GmbH, Nuremberg, Germany, or under the trade names 1500 Series UV Flexiform, 1600 Power Print Series, 1700 Versa Print, 3200 Series, 1800 Power Print plus, 9700 Series, PP Series, 7200 Lacquer and 7900 Series by Nazdar, Shawnee, United States of America.

For a printing ink, ink, paste, formulation, lacquer or adhesive that cures under ultraviolet light there are suitable, in particular as binders, for example epoxy, ester, ether and/or urethane acrylates. Urethane acrylates can be used in the form of solutions in reactive diluents (low viscosity meth/acrylic acid esters), in the form of low viscosity oligomers, in the form of solids for powder coating technology or in the form of urethane acrylate dispersions. Urethane acrylates are obtainable, for example, under the trade name/mark Desmolux from Bayer MaterialScience AG (Leverkusen, Germany). For curing there are suitable, for example, electron-beam curing, mono cure technology and dual cure technology. Isocyanatourethane acryls are particularly suitable for dual cure technology.

The printing ink, ink, paste, formulation, lacquer or adhesive can be water-based or based on solvents other than water.

The printing ink, ink, paste, formulation, lacquer or adhesive, or the first and/or second polymer layer having holes, can comprise or be formed from one or more polyurethanes. In particular, the printing ink, ink, paste, formulation, lacquer or adhesive, or the first and/or second polymer layer having holes, can comprise or be formed from one or more one-component polyurethanes and/or one or more two-component polyurethanes and/or one or more aqueous polyurethane dispersions and/or one or more polyurethane hot-melt adhesives.

For example, the printing ink, ink, paste, formulation, lacquer or adhesive, or the first and/or second polymer layer having holes, can comprise or be formed from one or more one-component polyurethanes comprising prepolymers which can be prepared by reaction of alcohols with a stoichiometric excess of polyfunctional isocyanates having a mean functionality of greater than 2 and up to 4. The prepolymers can optionally further comprise additives and/or solvents.

The prepolymers can be obtained, for example, by reaction of polyisocyanates with alcohols which are mixtures of polyols with on average monofunctional alcohols, to form urethane groups and terminal isocyanate groups.

There can be used as polyols the polyols which are known to the person skilled in the art and are conventional in polyurethane chemistry, such as, for example, polyether, polyacrylate, polycarbonate, polycaprolactone, polyurethane and polyester polyols, as are described, for example, in Ullmanns Enzyklopädie der technischen Chemie, 4th Edition, Volume 19, p. 304-5, Verlag Chemie, Weinheim, or in Polyurethan Lacke, Kleb- and Dichtstoffe by Ulrich Meier-Westhues, Vincentz Network, Hanover, 2007. For example, the polyols called Desmophen® from Bayer MaterialScience AG, Leverkusen, Germany can be used.

As polyfunctional isocyanates having a mean functionality >2 there can be used the products which are conventional in polyurethane chemistry and known to the person skilled in the art, as are described, for example, in Ullmanns Enzyklopädie der technischen Chemie, 4th Edition, Volume 19, p. 303-4, Verlag Chemie, Weinheim. There may be mentioned as examples isocyanates trimerised via biuret groups, such as, for example, trimerised hexamethylene diisocyanate Desmodur® N (trade name of Bayer MaterialScience AG, Leverkusen, Germany), or mixtures thereof with diisocyanates, or isocyanates trimerised via isocyanurate groups, or mixtures thereof with diisocyanates. The adducts of diisocyanates with polyols, for example of toluene diisocyanate with trimethylolpropane, are also suitable.

There can be added to the prepolymers additives such as catalysts for accelerating curing, for example tertiary amines, such as dimorpholinodiethyl ether, bis-[2-N,N-(dimethylamino)ethyl]ether or tin compounds, such as dibutyltin dilaurate or tin(II) octoate, anti-ageing agents and light stabilisers, drying agents, stabilisers, for example benzoyl chloride, adhesion promoters for improving adhesion, plasticisers, for example dioctyl phthalate, as well as pigments and fillers.

Because of the sensitivity of the isocyanates to moisture, it is generally necessary to work with the careful exclusion of water, that is to say anhydrous raw materials are to be used and the admission of moisture during the reaction is to be avoided.

The prepolymers can be prepared by reacting the mixture of polyols and monofunctional alcohol with a stoichiometric excess of di- or poly-functional isocyanate compound. It is also possible, however, to react the monofunctional hydroxyl compound with the isocyanate compound in a preceding reaction.

The printing ink, ink, paste, formulation, lacquer or adhesive, or the first and/or second polymer layer having holes, can, however, also comprise or be formed from one or more two-component polyurethanes, which comprise, for example, a component having isocyanate groups and an isocyanate-reactive component.

There can be used as suitable polyisocyanates for the printing ink, ink, paste, formulation, lacquer or adhesive, or the first and/or second polymer layer having holes, the NCO-functional compounds having a functionality of preferably 2 or more that are known per se to the person skilled in the art. These are typically aliphatic, cycloaliphatic, araliphatic and/or aromatic di- or tri-isocyanates as well as the higher molecular weight secondary products thereof having iminooxadiazinedione, isocyanurate, uretdione, urethane, allophanate, biuret, urea, oxadiazinetrione, oxazolidinone, acylurea and/or carbodiimide structures, which contain two or more free NCO groups.

Examples of such di- or tri-isocyanates are tetramethylene diisocyanate, cyclohexane-1,3- and -1,4-diisocyanate, hexamethylene diisocyanate (HDI), 1-isocyanato-3,3,5-trimethyl-5-isocyanatomethyl-cyclohexane (isophorone diisocyanate, IPDI), methylene-bis-(4-isocyanatocyclohexane), tetramethylxylylene diisocyanate (TMXDI), triisocyanatononane, toluoylene diisocyanate (TDI), diphenylmethane-2,4'- and/or -4,4'- and/or -2,2'-diisocyanate (MDI), triphenylmethane-4,4'-diisocyanate, naphthylene-1,5-diisocyanate, 4-isocyanatomethyl-1,8-octane diisocyanate (nonane triisocyanate, triisocyanatononane, TIN) and/or 1,6,11-undecane triisocyanate as well as arbitrary mixtures thereof and optionally also mixtures of other di-, tri- and/or poly-isocyanates. Such polyisocyanates typically have isocyanate contents of from 0.5 wt. % to 60 wt. %, preferably from 3 wt. % to 30 wt. %, particularly preferably from 5 wt. % to 25 wt. %.

There are preferably used in the printing ink, ink, paste, formulation, lacquer or adhesive, or the first and/or second polymer layer having holes, the higher molecular weight compounds having isocyanurate, urethane, allophanate, biuret, iminooxadiazinetrione, oxadiazinetrione and/or uretdione groups based on aliphatic and/or cycloaliphatic and/or aromatic diisocyanates.

There are particularly preferably used in the printing ink, ink, paste, formulation, lacquer or adhesive, or the first and/or second polymer layer having holes, compounds having biuret, iminooxadiazinedione, isocyanurate and/or uretdione groups based on hexamethylene diisocyanate, isophorone diisocyanate, 4,4'-diisocyanatodicyclohexylmethane, diphenylmethane-4,4'-diisocyanate, diphenylmethane-2,4'-diisocyanate, 2,4-toluoylene diisocyanate, 2,6-toluoylene diisocyanate and/or xylylene diisocyanate.

The preparation and/or use of the isocyanate-containing component can be carried out in a solvent. Examples are N-methylpyrrolidone, N-ethylpyrrolidone, xylene, solvent naphtha, toluene, butyl acetate, methoxypropyl acetate, acetone or methyl ethyl ketone. It is possible to add solvents when the isocyanate groups have reacted completely. It is also possible to use protic solvents, such as alcohols, which serve, for example, to stabilise the solution or to improve the lacquer properties. Arbitrary mixtures of solvents are also possible. The amount of solvent is generally such that 20 wt. % to <100 wt. %, preferably 50 wt. % to 90 wt. %, solutions are obtained.

Catalysts can also be added in order to accelerate the crosslinking. Suitable catalysts are described in "Polyurethane Chemistry and Technology", Volume XVI, Part 1, Section IV, pages 129-211, The Kinetics and Catalysis of the Isocyanate Reactions. Tertiary amines, tin, zinc or bismuth compounds, or basic salts are suitable, for example. Dibutyltin dilaurate and octoate are preferred.

Suitable isocyanate-reactive components, such as, for example, polyhydroxyl compounds, are known per se to the person skilled in the art. They are preferably the binders known per se based on polyhydroxy polyesters, polyhydroxy polyurethanes, polyhydroxy polyethers, polycarbonate diols or on hydroxyl-group-containing polymers, such as the polyhydroxy polyacrylates, polyacrylate polyurethanes and/or polyurethane polyacrylates known per se. Examples which may be mentioned are the polyols called Desmophen® from Bayer MaterialScience AG, Leverkusen, Germany.

The printing ink, ink, paste, formulation, lacquer or adhesive, or the first and/or second polymer layer having holes, can, however, also comprise or be formed from one or more aqueous polyurethane dispersions, for example a polyurethane-polyurea dispersion. Suitable aqueous polyurethane dispersions for formulating the printing ink, ink, paste, formulation, lacquer or adhesive are those such as are described, for example, in U.S. Pat. No. 2,479,310 A, U.S. Pat. No. 4,092,286 A, DE 2 811 148 A, DE 3603996 and EP 08019884.

Suitable diol and/or polyol components for the preparation of polyurethane-polyurea dispersions are compounds having at least two hydrogen atoms that are reactive towards isocyanates, and a mean molecular weight of from 62 to 18,000 g/mol, preferably from ≥62 to ≤4000 g/mol. Examples of suitable chain-extension components are polyethers, polyesters, polycarbonate, polylactones and polyamides. Preferred polyols contain from ≥2 to ≤4, preferably from ≥2 to ≤3, hydroxyl groups. Mixtures of different compounds of this type are also suitable.

The polyurethane-polyurea dispersion can be used either alone or in combination with one or more hydrophilically modified crosslinkers. The additional crosslinking of the polyurethane-polyurea polymer brings about a marked increase in the heat resistance and hydrolytic stability of the adhesive compound.

It is also possible to use one or more latent-reactive polyurethane-polyurea dispersions. Latent-reactive polyurethane-polyurea dispersions are described, for example, in EP 0 922 720 A and WO 2008/071307. The advantage of this product class is that the crosslinking reaction of the polymer is initiated when the polymer layer having holes is heated during the lamination process, as is necessary in any case.

The dispersion can be used on its own or with binders, auxiliary substances and/or added ingredients known in coating and adhesives technology, in particular emulsifiers and light stabilisers, such as UV absorbers and sterically hindered amines (HALS), antioxidants, fillers, antisettling agents, antifoams, wetting agents, flow improvers, reactive diluents, plasticisers, neutralising agents, catalysts, auxiliary solvents and/or thickeners and/or additives, such as pigments, colourings or mattifying agents. Tackifiers can also be added. The additives can be added immediately before processing. It is also possible, however, to add at least some of the additives before or during the dispersion of the binder.

The choice and metering of these substances, which can be added to the individual components and/or to the mixture as a whole, are known in principle to the person skilled in the art and, without an unduly high outlay, can be determined by means of simple preliminary tests, customised to the specific application in question.

The rheology of the aqueous polyurethane dispersions is preferably adjusted, by means of suitable thickeners, so that they no longer flow after application, for example to the continuous polymer layer. The intrinsic viscosity of the liquid limit in particular can be high. The use of such an aqueous polyurethane dispersion has the advantage that the polymer layer having holes can first be dried after application, whereby the polyurethane polymer—depending on the polymer or polymer mixture used—solidifies and/or crystallises amorphously and the polymer layer having holes can be heated in a subsequent lamination process to just such an extent that the polyurethane polymer softens and/or melts and the continuous polymer layer is wetted, the structure of the polymer layer having holes being retained.

The printing ink, ink, paste, formulation, lacquer or adhesive, or the first and/or second polymer layer having holes, can, however, also comprise or be formed from a reactive or non-reactive polyurethane hot-melt adhesive.

Suitable reactive polyurethane hot-melt adhesives are described, for example, in DE 3827724, DE 4114229 and EP 354527. These hot-melt adhesives have free isocyanate groups which, after application, crosslink with moisture from the substrate and thus achieve the required heat resistance.

The polyurethane hot-melt adhesives can be used on their own or with binders, auxiliary substances and/or added ingredients known in coating and adhesives technology, in particular light stabilisers, such as UV absorbers and sterically hindered amines (HALS), also antioxidants, fillers, wetting agents, flow improvers, reactive diluents, plasticisers, neutralising agents, catalysts, auxiliary solvents, tackifiers and/or additives, such as pigments, colourings or mattifying agents. The additives can be added immediately before processing. It is also possible, however, to add at least some of the additives before or during the preparation of the reactive hot-melt adhesive.

The choice and metering of these substances, which can be added to the individual components and/or to the mixture as a whole, are known in principle to the person skilled in the art and, without an unduly high outlay, can be determined by means of simple preliminary tests, customised to the specific application in question.

Suitable non-reactive polyurethane hot-melt adhesives are described, for example, in DE 1256822, DE 1930336 or EP 192946. Further suitable non-reactive hot-melt adhesives are polyesters and copolyesters, polyamide, polyolefins (APAO), ethylene-vinyl acetate copolymers, polyester elastomers, polyurethane elastomers and copolyamide elastomers.

The printing ink, ink, paste, formulation, lacquer or adhesive, or the first and/or second polymer layer having holes, preferably further comprises at least one additive for improving the electret and/or electromechanical, for example piezoelectric, properties. The additive can improve any polymer properties and parameters that have an effect on the electromechanical, for example piezoelectric, properties of the material. For example, the additive can improve the dielectric constant, the modulus of elasticity, the viscoelastic behaviour, the maximum elongation and/or the dielectric strength of the polymer or polymer mixture. Preference is given to the use of an additive that lowers the dielectric constant and/or the electrical conductivity and/or the modulus of elasticity of the polymer and/or increases the dielectric strength of the polymer. For example, clay particles, fine ceramics powders and/or plasticisers, such as hydrocarbon oils, mineral oils, silicone oils and/or silicone elastomers, in particular having a high molecular weight, can be used as additives. A plurality of properties of the material can advantageously be improved simultaneously by choosing a plurality of additives. The printing ink, ink, paste, formulation, lacquer or adhesive, or the first and/or second polymer layer having holes, can further comprise additives that facilitate application of the polymer layer having holes. These are, for example, flow additives, antifoams and/or rheology additives as well as added ingredients for improving the properties of the polymer layer having holes, such as plasticisers.

The printing ink, ink, paste, formulation, lacquer or adhesive, or the first and/or second polymer layer having holes, can further comprise solvents, in particular before the electromechanical converter is produced. Examples thereof are ethyl acetate, butyl acetate, methoxypropyl acetate, ethoxypropyl acetate, acetone, cyclohexanone, toluene, xylene, Solvesso 100, Shellsol A and/or mixtures of two or more of these solvents.

The first and/or second and/or third continuous polymer layers are preferably compact polymer layers. The term "compact" within the scope of the present invention means that the continuous polymer layers contain as few inclusions, such as gas bubbles, as possible, in particular no such inclusions. In particular, the continuous polymer layers can be polymer films. The first and/or second and/or third continuous polymer layers can in principle be produced independently of one another by any known processes for the production of layers and films, in particular thin layers and films. For example, the first and/or second and/or third continuous polymer layers can be produced, independently of one another, by extrusion, application by doctor blade, in particular solution application by doctor blade, spin coating or spraying. However, it is possible within the scope of the present invention also to use commercially available continuous polymer layers or polymer films as the first and/or second and/or third continuous polymer layer.

Within the scope of the present invention, the first and/or second and/or third continuous polymer layers can in principle be formed, independently of one another, from any polymer or polymer mixture that is suitable for retaining charge over a long period of time, for example several months or years. For example, the first and/or second and/or third continuous polymer layers can comprise or consist of almost any identical or different polymer materials. For example, the first and/or second and/or third continuous polymer layers can comprise or be formed from at least one polymer selected from the group consisting of polycarbonates, perfluorinated or partially fluorinated polymers and copolymers, such as polytetrafluoroethylene (PTFE), fluoroethylenepropylene (FEP), perfluoroalkoxyethylenes (PFA), polyesters, such as polyethylene terephthalate (PET) or polyethylene naphthalate (PEN), polyimides, in particular polyether imide, polyethers, polymethyl methacrylates, cycloolefin polymers, cycloolefin copolymers, polyolefins, such as polypropylene, and mixtures of these polymers. Such polymers are advantageously able to retain the polarisation that is introduced over a long period of time. Suitable polycarbonates are obtainable, for example, by reaction of carbonic acid derivatives, such as diphenyl carbonate, dimethyl carbonate or phosgene, with polyols, preferably diols. Examples of suitable diols are ethylene glycol, 1,2-propanediol, 1,3-propanediol, 1,3-butanediol, 1,4-butanediol, 1,6-hexanediol, 1,8-octanediol, neopentyl glycol, 1,4-bis-hydroxymethylcyclohexane, 2-methyl-1, 3-propanediol, 2,2,4-trimethyl-1,3-pentanediol, dipropylene glycol, polypropylene glycols, dibutylene glycol, polybutylene glycols, bisphenol A, bisphenol F, trimethyl-cyclohexyl-bisphenol (bisphenol-TMC), mixtures of these and lactone-modified diols. Polycarbonates prepared from bisphenol A, bisphenol F, trimethyl-cyclohexyl-bisphenol (bisphenol-TMC) and mixtures thereof are preferred, and polycarbonates based on bisphenol A are most particularly preferred. In addition, the continuous polymer layers, independently of one another, can comprise or be formed from a homopolymer.

In addition, the first and/or second and/or third continuous polymer layer can comprise at least one additive for improving the electret and/or electromechanical, for example piezoelectric, properties. The additive can improve any polymer properties and parameters that have an effect on the electromechanical, for example piezoelectric, properties of the material. For example, the additive can improve the electret properties, the dielectric constant, the modulus of elasticity, the viscoelastic behaviour, the maximum elongation and/or the dielectric strength of the polymer or polymer mixture. Preference is given to the use of an additive or a plurality of additives that improve the electret properties, that is to say increase the charge-storing ability, lower the electrical conductivity and/or increase the dielectric strength of the polymer. For example, clay particles, fine ceramics powders and/or plasticisers, such as hydrocarbon oils, mineral oils, silicone oils and/or silicone elastomers, in particular having a high molecular weight, can be used as additives. A plurality of properties of the material can advantageously be improved simultaneously by choosing a plurality of additives.

Within the scope of the present invention, in particular in the electromechanical converter, the first and/or second and/or third continuous polymer layers, independently of one another, can have, for example, a layer thickness of from $\geq 10$ μm to $\leq 500$ μm, for example from $\geq 20$ μm to $\leq 250$ μm.

In addition to the first and/or second and/or third continuous polymer layer, the converter according to the invention can comprise one or more further continuous polymer layers. Such a further continuous polymer layer can be arranged, for example, on the side of the first and/or second and/or third continuous polymer layer that is opposite the adjacent polymer layer having holes.

The continuous polymer layers can optionally be tempered before they are used in the process according to the invention or within the scope of the process according to the invention.

The process can further comprise process step D): applying an electrode to the first continuous polymer layer and an electrode to the covering, in particular to the continuous polymer layer (second or third) of the covering. However, within the scope of the present invention, the electrodes can also be provided together with the first and/or second and/or third continuous polymer layer, in particular can in each case be formed thereon. The electrodes are applied to the outside, that is to say to the side of the first continuous polymer layer or of the covering that is remote from the holes.

The electrodes can be applied by means of processes known to the person skilled in the art. Processes such as, for example, sputtering, vapour deposition, chemical vapour deposition (CVD), printing, application by doctor blade, spin coating are suitable. The electrodes can also be applied in prefabricated form by adhesive bonding.

The electrode materials can be conductive materials known to the person skilled in the art. There are suitable, for example, metals, metal alloys, semiconductors, conductive oligomers or polymers, such as polythiophenes, polyanilines, polypyrroles, conductive oxides or mixed oxides, such as indium tin oxide (ITO), or polymers filled with conductive fillers. Suitable fillers for polymers filled with conductive fillers are, for example, metals, conductive carbon-based materials, for example carbon black, carbon nanotubes (CNTs), or conductive oligomers or polymers. The filler content of the polymers is preferably above the percolation threshold, which is characterised in that the conductive fillers form continuous electrically conductive paths.

Within the scope of the present invention, the electrodes can also be structured. For example, the electrodes can be so structured that the converter exhibits active and passive regions. In particular, the electrodes can be so structured that, in particular in sensor mode, the signals are detected in a space-resolved manner and/or, in particular in actuator mode, the active regions can purposively be triggered. This can be achieved, for example, by providing the active regions with electrodes while the passive regions do not have electrodes.

The process can further comprise process step E): charging the arrangement, in particular sandwich arrangement, obtained in process step C). In particular, the first continuous polymer layer and the covering, in particular the continuous polymer layer (second or third) of the covering, can be charged with charges having different signs. Charging can be carried out, for example, by tribocharging, electron beam bombardment, application of a voltage to the electrodes, or corona discharge. In particular, charging can be carried out by means of a twin-electrode corona arrangement. The needle voltage can be at least $\geq 20$ kV, for example at least $\geq 25$ kV, in particular at least $\geq 30$ kV. The charge time can be at least $\geq 20$ s, for example at least $\geq 30$ s, in particular at least $\geq 1$ minute. Within the scope of the present invention, it is possible either to carry out first process step D) and then process step E) or to carry out first process step E) and then process step D).

The process can further comprise process step F): stacking two or more arrangements, in particular sandwich arrangements, obtained in process step C). The first continuous polymer layer and the covering, in particular the continuous layer (two or three) of the covering, can in each case be in contact with an electrode. Two adjacent continuous polymer layers of different arrangements obtained in process step C) are preferably charged with the same polarisation. In particular, two adjacent continuous polymer layers of different arrangements obtained in process step C) can be in contact with the same electrode, or the same electrode can be in contact therewith.

With regard to further features of a process according to the invention, reference is made explicitly to the explanations given in connection with the electromechanical converter according to the invention and its use.

The present invention further provides an electromechanical, for example piezoelectric, converter, in particular produced by a process according to the invention, which comprises a first continuous polymer layer, a first polymer layer having holes, and a covering, the first polymer layer having holes being arranged between the first continuous polymer layer and the covering, the holes of the first polymer layer having holes being closed on one side by the first continuous polymer layer and on the other side by the covering to form voids.

Because the production process according to the invention is based on a printing and/or coating process, the nature of the surfaces delimiting the holes in particular can be different from that of the surfaces delimiting the holes of holes produced by drilling. For example, the surfaces delimiting holes resulting from the process according to the invention could have fewer burrs and other sharp-edged surface irregularities, which cannot be specified by characteristic values but nevertheless could have an effect, in particular a negative effect, on the electromechanical, in particular piezoelectric, properties.

In an embodiment of the electromechanical converter, the covering comprises a second polymer layer having holes and a second continuous polymer layer, the second continuous polymer layer being arranged on the second polymer layer having holes, and the second polymer layer having holes being arranged on the first polymer layer having holes, in particular to form common voids.

In an embodiment of the electromechanical converter, the covering is a third continuous polymer layer.

In an embodiment of the electromechanical converter, the first polymer layer having holes comprises holes of different shapes, and/or the second polymer layer having holes comprises holes of different shapes.

As already explained, it is advantageously possible by using a combination of holes of different shapes on the one hand to maximise the total void volume of the resulting voids and on the other hand to adjust the electromechanical, in particular piezoelectric, properties.

The holes of the first polymer layer having holes and/or the holes of the second polymer layer having holes can optionally be partially or completely interconnected.

In an embodiment of the electromechanical converter, at least some of the holes of the first polymer layer having holes have shapes that do not have a circular, in particular substantially circular, cross-sectional area, and/or at least some of the holes of the second polymer layer having holes have shapes that do not have a circular, in particular substantially circular, cross-sectional area.

As has also already been explained, the at least partial avoidance of holes having a circular, in particular a substantially circular, cross-sectional area enables the total void volume to be increased.

The first and second polymer layers having holes can in particular be congruent, in particular identical.

The holes in the first and/or second polymer layer having holes can be distributed homogeneously or heterogeneously. In particular, the holes in the first and/or second polymer layer having holes can be distributed homogeneously. Depending on the field of application of the electromechanical converter that is to be produced, however, it can also be advantageous for the holes in the first and/or second polymer layer having holes to be distributed, in particular purposively, heterogeneously in a space-resolved manner.

The holes of the first polymer layer having holes preferably pass right through the first polymer layer having holes, in particular in the direction of the continuous polymer layers; and/or the holes of the second polymer layer having holes pass right through the second polymer layer having holes, in particular in the direction of the continuous polymer layers.

The first and/or second polymer layer having holes can have a plurality of holes of a first shape and a plurality of holes of a second shape and optionally a plurality of holes of a third shape, etc. Holes of different shapes in the first and/or second polymer layer having holes can be distributed homogeneously or heterogeneously and/or can be partially or completely interconnected.

Within the scope of the present invention, some or all of the holes can have, for example, shapes having a cross-sectional area selected from the group consisting of substantially round, for example circular, elliptical or oval, polygonal, for example triangular, rectangular, trapezoidal, rhombic, pentagonal, hexagonal, in particular honeycomb, cross-shaped, star-shaped and partially round and partially polygonal, for example S-shaped, cross-sectional areas. The holes of the first and/or second layer having holes preferably have a honeycomb cross-sectional area or are shaped and/or arranged in a honeycomb; particularly preferably, the holes of the first and second layers having holes have a honeycomb cross-sectional area or are shaped and/or arranged in a honeycomb. A honeycomb shape and arrangement of the holes on the one hand results in a very large total void volume. On the other hand, a honeycomb shape and arrangement of the holes can have high mechanical stability.

The size of the cross-sectional areas can be the same or different in all the holes of the polymer layer having holes.

The first and/or second polymer layers having holes can each have, for example, a layer thickness of from ≥1 μm to ≤800 μm, in particular from ≥10 μm to ≤400 μm. If the electromechanical converter has only one polymer layer having holes, then the first polymer layer having holes can have a layer thickness of from ≥1 μM to ≤800 μm, for example from ≥10 μm to ≤400 μm. If the electromechanical converter has both a first and a second polymer layer having holes, then the overall layer thickness of the first polymer layer having holes and of the second polymer layer having holes can be from ≥1 μm to ≤800 μm, for example from ≥10 μm to ≤400 μm.

The first and/or second and/or third continuous polymer layers, independently of one another, can have a layer thickness of, for example, from ≥10 μm to ≤500 μm, for example from ≥20 μm to ≤250 μm.

The first and/or second polymer layer having holes can, for example, comprise or be formed from at least one polymer selected from the group consisting of cellulose esters, cellulose ethers, rubber derivatives, polyester resins, unsaturated polyesters, alkyd resins, phenolic resins, amino resins, amido resins, ketone resins, xylene-formaldehyde resins, epoxy resins, phenoxy resins, polyolefins, polyvinyl chloride, polyvinyl esters, polyvinyl alcohols, polyvinyl acetals, polyvinyl ethers, polyacrylates, polymethacrylates, polystyrenes, polycarbonates, polyesters, copolyesters, polyamides, silicone resins, polyurethanes, in particular polyurethanes, and mixtures of these polymers. In particular, the first and/or second polymer layer having holes can comprise or be formed from one or more one-component polyurethanes and/or one or more two-component polyurethanes and/or one or more polyurethane hot-melt adhesives.

The first and/or second and/or third continuous polymer layer can, for example, comprise or be formed from at least one polymer selected from the group consisting of polycarbonates, perfluorinated or partially fluorinated polymers and copolymers, such as polytetrafluoroethylene (PTFE), fluoroethylenepropylene (FEP), perfluoroalkoxyethylenes (PFA), polyesters, such as polyethylene terephthalate (PET) or polyethylene naphthalate (PEN), polyimides, in particular polyether imide, polyethers, polymethyl methacrylates, cycloolefin polymers, cycloolefin copolymers, polyolefins, such as polypropylene, and mixtures of these polymers.

Preferably, an electromechanical converter further comprises two electrodes, in particular electrode layers, one electrode being in contact with the first continuous polymer layer and the other electrode being in contact with the covering, in particular the continuous polymer layer (second or third) of the covering. Furthermore, the first continuous polymer layer and the covering, in particular the continuous polymer layer (second or third) of the covering, can have electrical charges with different signs. In particular, an electromechanical converter according to the invention can comprise two or more arrangements, in particular sandwich arrangements, stacked one on top of the other, each of which comprises a first continuous polymer layer, a first polymer layer having holes, and a covering, the first polymer layer having holes being arranged between the first continuous polymer layer and the covering, the holes of the first polymer layer having holes being closed on one side by the first continuous polymer layer and on the other side by the covering to form voids. The first continuous polymer layer and the covering, in particular the continuous layer (two or three) of the covering, can each be in contact with an electrode. Preferably, two adjacent continuous polymer layers of different arrangements have the same charge polarisation. In particular, two adjacent continuous polymer layers of different arrangements are in contact with the same electrode.

With regard to further features of an electromechanical converter according to the invention, reference is made explicitly to the explanations given in connection with the process according to the invention and the use according to the invention.

The present invention further provides the use of a converter according to the invention as a sensor, generator and/or actuator, for example in the electromechanical and/or electroacoustic field, in particular in the field of obtaining energy from mechanical vibrations (energy harvesting), acoustics, ultrasonics, medical diagnostics, acoustic microscopy, mechanical sensor systems, in particular pressure, force and/or strain sensor systems, robotics and/or communication technology, in particular in loudspeakers, vibration converters, light deflectors, membranes, modulators for fibre optics, pyroelectric detectors, capacitors and control systems.

With regard to further features of a use according to the invention, reference is made explicitly to the explanations given in connection with the process according to the invention and the electromechanical converter according to the invention.

Drawings and Test Description

The production according to the invention and the structure of an electromechanical, for example piezoelectric, converter according to the invention are explained in greater detail by means of the drawings, the description of the drawings given hereinbelow and the following test descriptions. It is to be noted that the drawings and the test descriptions are merely descriptive in nature and are not intended to limit the invention in any way.

Drawings

Figure 4:
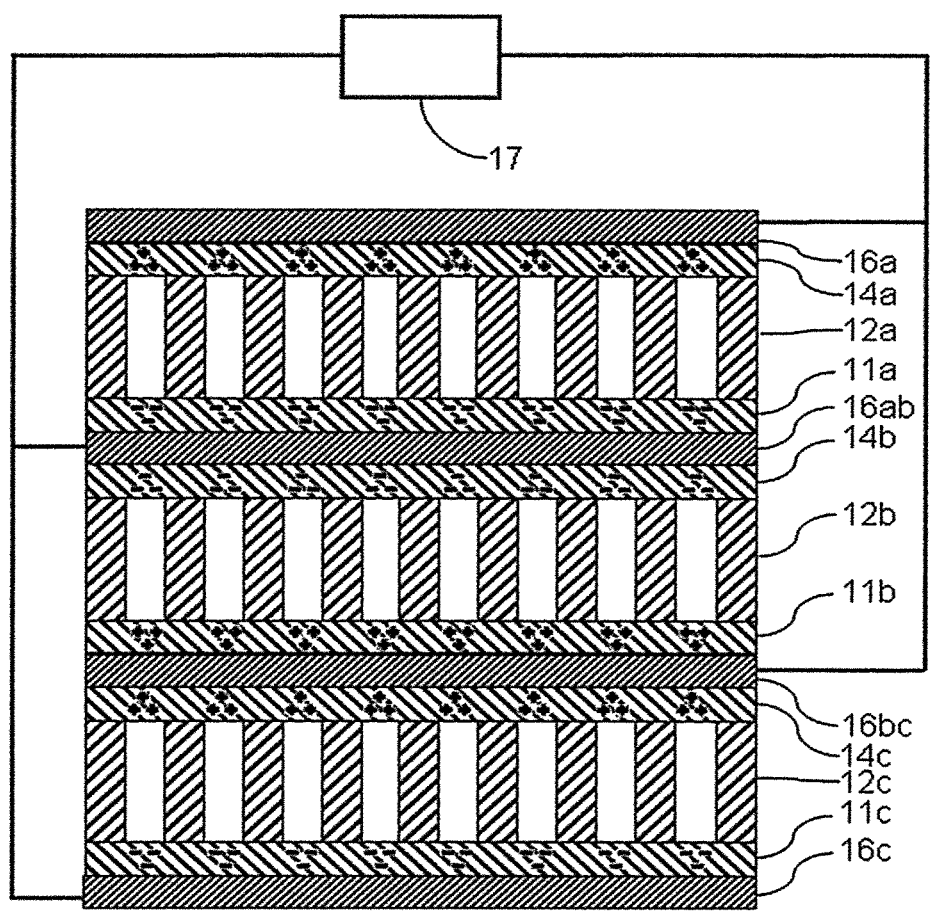

FIG. 4 shows, in diagrammatic form, a cross-section through a converter according to the invention having three arrangements stacked one above the other, each arrangement comprising a first continuous polymer layer, a first polymer layer having holes, and a covering in the form of a third continuous polymer layer; and FIG. 5a-5i show top views of different embodiments of polymer layers having holes.

Figure 1A:
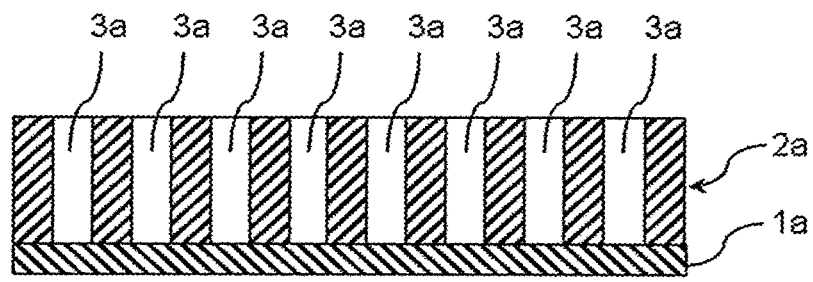
FIG. 1a shows, in diagrammatic form, a cross-section through a first polymer layer having holes applied to a first continuous polymer layer.

FIG. 1a shows, in diagrammatic form, a cross-section through a first continuous polymer layer 1a, to which a first polymer layer 2a having holes 3a has been applied.

Figure 1B:
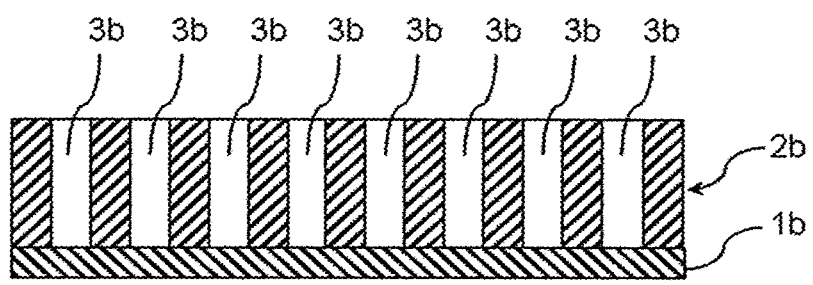
FIG. 1b shows, in diagrammatic form, a cross-section through a form of covering comprising a second polymer layer having holes and a second continuous polymer layer.

FIG. 1b shows, in diagrammatic form, a cross-section through a form of covering comprising a second polymer layer 2b having holes 3b and a second continuous polymer layer 1b.

Figure 1C:
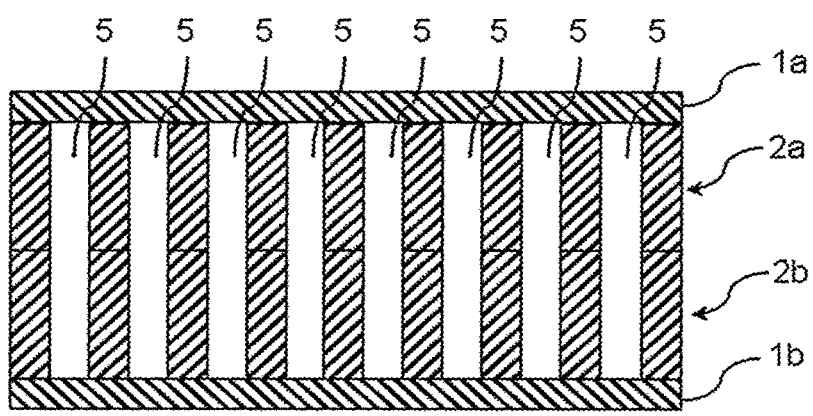
FIG. 1c shows, in diagrammatic form, a cross-section through the layer arrangement shown in FIG. 1a, to which the covering shown in FIG. 1b has been applied.

FIG. 1c shows, in diagrammatic form, a cross-section through the layer arrangement shown in FIG. 1a, to which the covering shown in FIG. 1b has been applied. FIG. 1c shows that the holes 3a of the first polymer layer 2a having holes 3a and the holes 3b of the second polymer layer 2b having holes 3b are so formed and arranged that, after application of the covering 1b, 2b to the first polymer layer 2a having holes 3a, a hole 3a of the first polymer layer 2a having holes 3a and a hole 3b of the second polymer layer 2b having holes 3b overlap completely to form a common void 5.

Figure 2A:
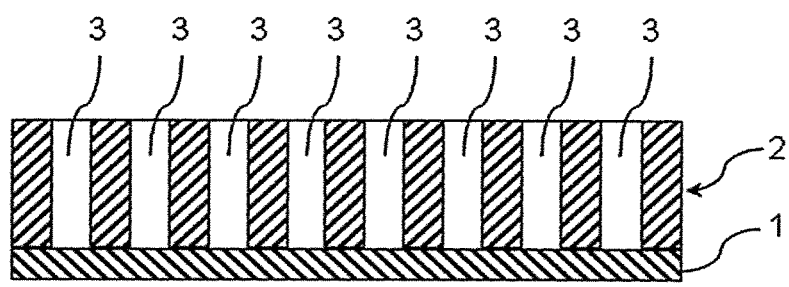
FIG. 2a shows, in diagrammatic form, a cross-section through a first polymer layer having holes applied to a first continuous polymer layer.

FIG. 2a shows, in diagrammatic form, a cross-section through a first continuous polymer layer 1, to which a first polymer layer 2 having holes 3 has been applied. FIG. 2a shows that the holes 3 of the first polymer layer having holes pass right through the polymer layer 2 having holes 3.

Figure 2B:
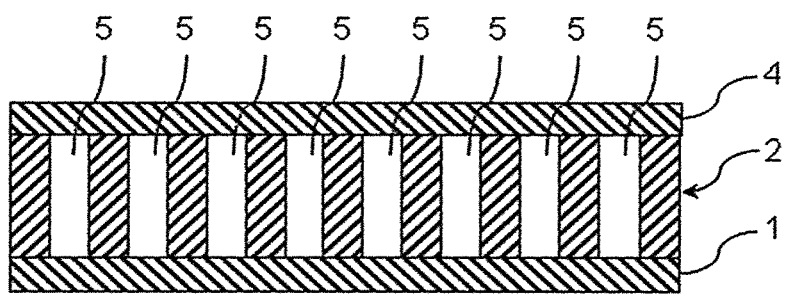
FIG. 2b shows, in diagrammatic form, a cross-section through the layer arrangement shown in FIG. 2a, to which a covering in the form of a third continuous polymer layer has been applied.

FIG. 2b shows that a covering in the form of a third continuous polymer layer 4 has been applied to the first polymer layer 2 having holes 3 of the layer arrangement shown in FIG. 1a. FIG. 2b shows that the holes 3 of the first polymer layer 2 having holes 3 have been closed on one side by the first continuous polymer layer 1 and on the other side by the third continuous polymer layer 4 to form voids.

Figure 3A:
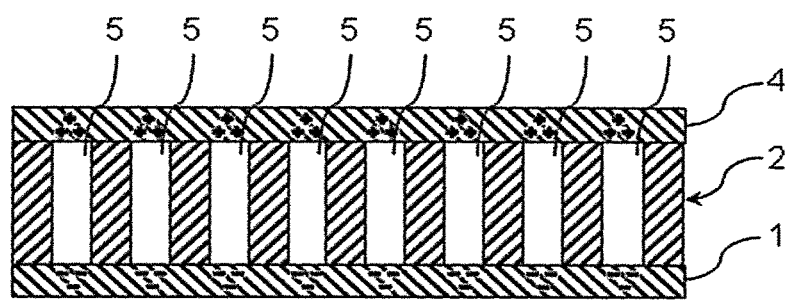
FIG. 3a shows, in diagrammatic form, a cross-section through the arrangement shown in FIG. 2b after the charging process.

FIG. 3a shows, in diagrammatic form, a cross-section through the arrangement shown in FIG. 2b and shows the charge distribution after charging of the arrangement shown in FIG. 2b. FIG. 3a shows that the negative charges are located on the first continuous polymer layer 1 and the positive charges on the third continuous polymer layer 4.

Figure 3B:
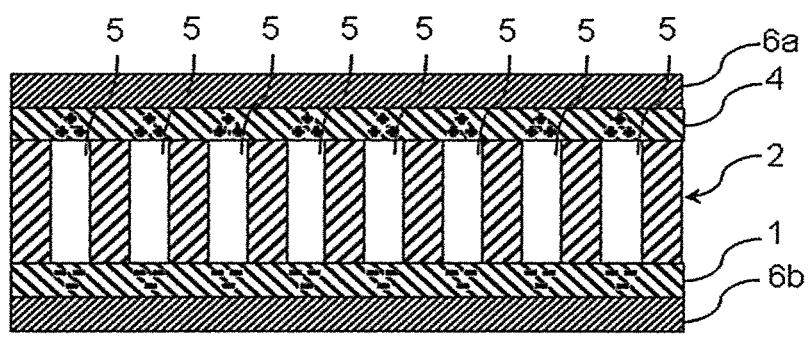
FIG. 3b shows, in diagrammatic form, a cross-section through the arrangement shown in FIG. 2b after the charging process and after the application of electrodes.

FIG. 3b shows, in diagrammatic form, a cross-section through the arrangement shown in FIG. 2b after the charging process and after the application of electrodes. The first 1 and third 4 continuous polymer layers are each in contact with an electrode 6a, 6b. The electrodes 6a, 6b are in the form of electrode layers on the sides of the first 1 and third 4 polymer layers that are opposite the sides adjoining the polymer layer 2 having holes and forming the voids 5.

FIG. 4 shows, in diagrammatic form, a cross-section through a converter according to the invention having three arrangements stacked one on top of the other, each arrangement comprising a first continuous polymer layer 11a, 11b, 11c, a first polymer layer 12a, 12b, 12c having holes, and a covering in the form of a third continuous polymer layer 14a, 14b, 14c. FIG. 4 shows that two adjacent continuous polymer films 11a, 14b; 11b, 14c of different arrangements are charged with the same polarisation and are in contact with the same electrode 16ab; 16bc. FIG. 4 additionally shows the possibility of connecting the electrodes 16a, 16ab, 16bc, 16c to a voltage/current measuring/supply/storage device 17.

FIGS. 5a to 5i show different embodiments of polymer layers having holes 3 and hole forms. However, the embodiments and forms shown in FIGS. 5a to 5i are only examples and are not intended to limit the invention in any way. For reasons of clarity, only one hole of a particular shape is identified by a reference numeral by way of example in FIGS. 5a to 5i.

Figure 5A:
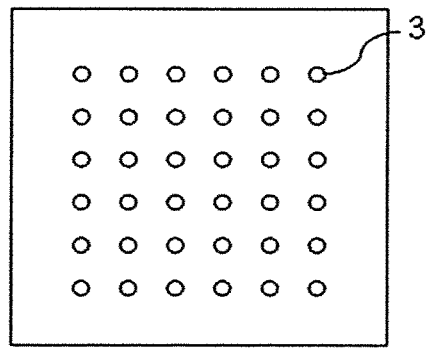

FIG. 5a shows a polymer layer having holes 3, the holes of which have a circular cross-sectional area. FIG. 5a additionally shows that a plurality of small holes 3 can be formed by the process according to the invention.

Figure 5B:
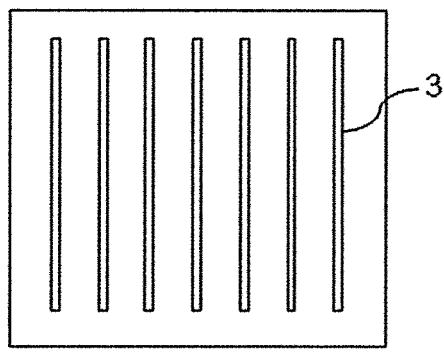

FIG. 5b shows a polymer layer having holes 3, the holes 3 of which have an elongate, rectangular cross-sectional area. FIG. 5b likewise shows that a plurality of small holes 3 can be formed by the process according to the invention.

Figure 5C:
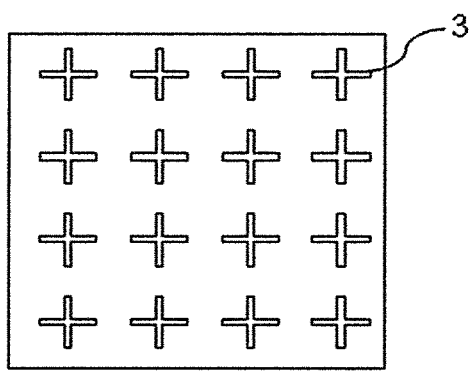

FIG. 5c shows a polymer layer having holes 3, the holes 3 of which have a cross-shaped cross-sectional area.

Figure 5D:
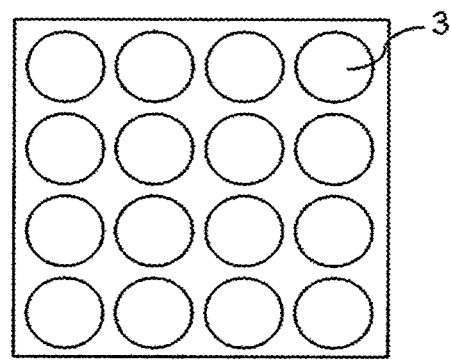

FIG. 5d shows a polymer layer having holes 3, the holes 3 of which have a circular cross-sectional area. FIG. 5d shows that it is not possible to achieve an optimum total void volume using only holes 3 having circular cross-sectional areas.

Figure 5E:
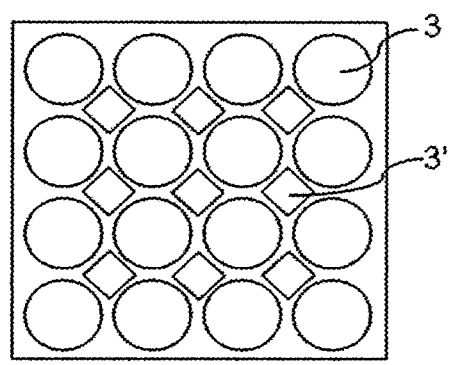

FIG. 5e shows a polymer layer having holes 3, 3', of which some of the holes have a circular cross-sectional area 3 and some have a rhombic cross-sectional area 3'. FIG. 5e shows that, with a homogeneously distributed arrangement of holes having circular 3 and a rhombic 3' cross-sectional areas, a larger total void volume can be achieved than in the case of the use of only holes 3 having circular cross-sectional areas as shown in FIG. 5d.

Figure 5F:
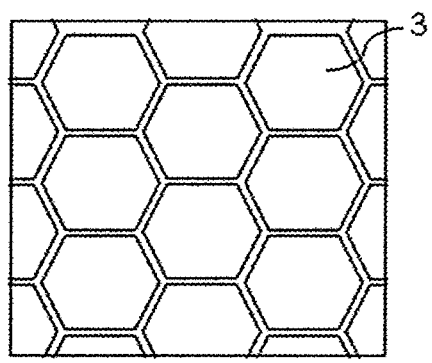

FIG. 5f shows a polymer layer having holes 3, the holes 3 of which have a honeycomb cross-sectional area. FIG. 5f shows that, by using an arrangement based solely on holes 3 having honeycomb cross-sectional areas, it is possible to achieve a markedly larger total void volume than in the case of the use of only holes 3 having circular cross-sectional areas as shown in FIG. 5d.

Figure 5G:
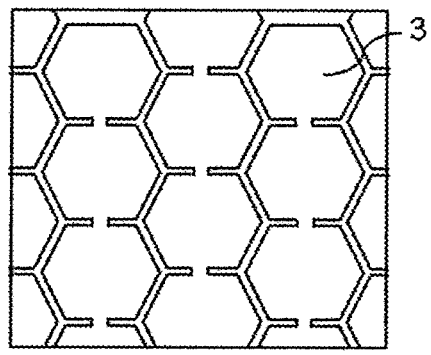

FIG. 5g shows a polymer layer having holes 3, the holes 3 of which have a honeycomb cross-sectional area and are partially interconnected.

Figure 5H:
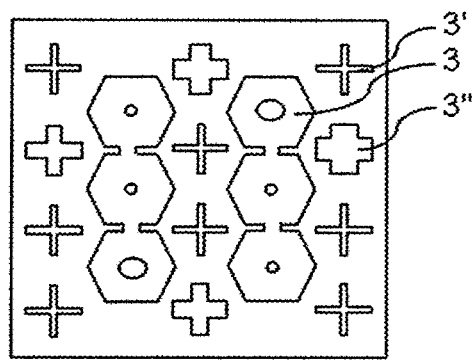

FIG. 5h shows a polymer layer having holes 3, 3', 3", the holes of which are of different shapes and sizes and have cross-shaped 3', 3" and substantially honeycomb 3 cross-sectional areas. FIG. 5h further shows that the holes are distributed inhomogeneously and are partially interconnected.

Figure 5I:
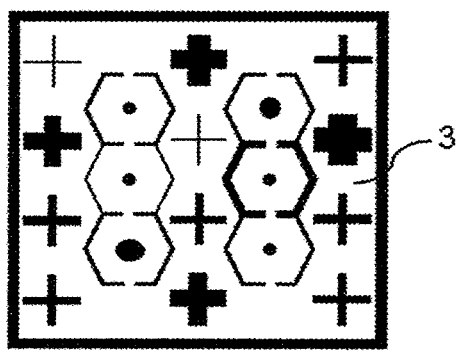

FIG. 5i shows a polymer layer having holes 3, the holes 3 of which have been formed by applying a combination of different structures, in particular of hexagons/honeycombs, crosses and points of different point and line thicknesses, to a continuous polymer layer 1 by a printing and/or coating process. FIG. 5i further shows that at least the edge regions of the continuous polymer layer can be printed and/or coated with a closed structure in order to obtain, on completion of the production process according to the invention, one or more closed voids in contact with the continuous polymer layers. In this manner, a continuous void can be formed. FIG. 5i further shows that, within the scope of the present invention, a polymer layer having holes can also be understood as being a polymer layer which has only one hole 3, in particular which can also be understood as being the combination or connection of a plurality of holes.

EXAMPLES

Test Description

Example 1

In order to produce a polymer layer having holes by a screen printing process, a first screen printing paste was formulated. This contained 47.14 wt. % Desmodur® N75 MPA and 52.11 wt. % Desmophen® 670. In order to reduce the flow of the paste and bubble formation during printing, 0.75 wt. % flow improver (BYK 410 50% in butoxyl) was added to the formulation.

Example 2

In order to produce a further polymer layer having holes by a screen printing process, a second screen printing paste was formulated. In this paste, 40.40 wt. % Desmodur® N75 MPA, 44.59 wt. % Desmophen® 670, 11.26 wt. % ethoxypropyl acetate, 3.30 wt. % flow improver and 0.45 wt. % of a 1:1 mixture of BYK 410 with butoxyl were used.

A number of screen printing experiments showed that it is possible using the screen printing pastes according to Examples 1 and 2 to apply both a single printed layer and a plurality of printed layers in succession. In particular, a printed layer can be applied to a previous printed layer that has not yet hardened completely (wet-on-wet process). It has been found that a plurality of printing steps can be carried out, with intermediate drying, in order to increase the layer thickness. For example, a printed layer can be applied twice, with intermediate drying, to a continuous polycarbonate film by the wet-on-wet process. Fabrics having from 12 to 200 threads per centimeter, preferably having from 22 to 120 threads per centimeter, were used for printing. In order to achieve a good layer thickness in the case of fine structures, a fabric having 90 threads per centimeter was used. In this manner it was possible to achieve layer thicknesses of from 7 µm to 12 µm by wet-on-wet printing and layer thicknesses of from 15 µm to 25 µm by wet-on-wet printing twice with intermediate drying.

The foregoing examples of the present invention are offered for the purpose of illustration and not limitation. It will be apparent to those skilled in the art that the embodiments described herein may be modified or revised in various ways without departing from the spirit and scope of the invention. The scope of the invention is to be measured by the appended claims.

What is claimed is:

1. A process for the production of an electromechanical transducer, comprising:
   A) applying a first polymer layer having holes to a first continuous polymer layer by means of a printing and/or coating process, with the exception of a laminating process;
   B) applying a covering to the first polymer layer having holes, so that the holes (of the first polymer layer having holes are closed to form voids; and
   C) joining the covering to the first polymer layer having holes,
   wherein
      in a process step D), applying a first electrode to the outside of the first continuous polymer layer and applying a second electrode to the outside of the covering, the first and second electrodes being applied independently of one another or simultaneously before or after one of steps A) to C), and
      in a process step E), charging the arrangement obtained after process step C) or after a process step following process step C).

2. The process according to claim 1, wherein
   the covering comprises a second polymer layer having holes and a second continuous polymer layer, the second polymer layer having holes being arranged on the second continuous polymer layer, the covering being so arranged that the second holes are arranged to face the first holes or
   the covering is a third continuous polymer layer.

3. The process according to claim 1, wherein the covering is produced by applying a second polymer layer having holes to a second continuous polymer layer by means of a printing and/or coating process.

4. The process according to claim 1, wherein the first polymer layer having holes is joined to the covering by
   partially hardening the material of the first polymer layer having holes after it has been applied to the first continuous polymer layer and/or
   partially hardening the material of the second polymer layer having holes after it has been applied to the second continuous polymer layer, and
   further hardening the material of the first polymer layer having holes after the covering has been applied and/or
   further hardening the material of the second polymer layer having holes after the covering has been applied.

5. The process according to claim 1, wherein application of the first polymer layer having holes and/or application of the second polymer layer having holes is carried out by application by one selected from the group consisting of doctor blade, spin coating, dip coating, spray coating, curtain coating, slot-die coating, flexographic printing, gravure printing, tampon printing, digital printing, thermal transfer printing, porous printing, a roller application process, a screen printing process and combinations thereof.

6. The process according to claim 3, wherein the holes of the first polymer layer having holes pass through the first polymer layer having holes and/or the holes of the second polymer layer having holes pass through the second polymer layer having holes.

7. The process according to claim 2, wherein the holes of the first polymer layer having holes and the holes of the second polymer layer having holes are so formed and arranged that, on application of the covering, a hole of the first polymer layer having holes and a hole of the second polymer layer having holes overlap at least partially.

8. The process according to claim 3, wherein the first polymer layer having holes and/or the second polymer layer having holes has holes of different shapes, preferably holes that are shaped and/or arranged in a honeycomb.

9. The process according to claim 3, wherein
   the first polymer layer having holes and/or the second polymer layer having holes comprises at least one polymer selected from the group consisting of cellulose esters, cellulose ethers, rubber derivatives, polyester resins, unsaturated polyesters, alkyd resins, phenolic resins, amino resins, amido resins, ketone resins, xylene-formaldehyde resins, epoxy resins, phenoxy resins, polyolefins, polyvinyl chloride, polyvinyl esters, polyvinyl alcohols, polyvinyl acetals, polyvinyl ethers, polyacrylates, polymethacrylates, polystyrenes, polycarbonates, polyesters, copolyesters, polyamides, silicone resins, polyurethanes and mixtures of these polymers, and
   the first continuous polymer layer and/or the second continuous polymer layer and/or a third continuous polymer layer comprises at least one polymer selected from the group consisting of polycarbonates, perfluorinated or partially fluorinated polymers and copolymers, polyesters, polyimides, polyethers, polymethyl methacrylates, cycloolefin polymers, cycloolefin copolymers, polyolefins and mixtures of these polymers.

10. The process according to claim 3, wherein
    the first polymer layer having holes has a layer thickness of from ≥1 μm to ≤800 μm, and the second polymer layer having holes has a layer thickness of from ≥1 μm to ≤800 μm, and
    the first continuous polymer layer and/or the second continuous polymer layer and a third continuous polymer layer has a layer thickness of from ≥10 μm to ≤500 μm.

11. The process according to claim 3, wherein the first polymer layer having holes and/or the second polymer layer having holes comprises one member selected from the group consisting of one-component polyurethanes, two-component polyurethanes, aqueous polyurethane dispersions, polyurethane hot-melt adhesives and combinations thereof.

12. An electromechanical transducer produced by a process according to claim 1.

13. The electromechanical transducer according to claim 12, wherein the first polymer layer having holes has holes of different shapes and/or the second polymer layer having holes has holes of different shapes.

14. One of a sensor, generator and actuator comprising the electromechanical transducer according to claim 12.

15. One of a pressure, force and strain sensor system comprising the electromechanical transducer according to claim 12.

16. One of a loudspeaker, vibration converter, light deflector, membrane, fiber optic modulator, pyroelectric detector, capacitors and control system comprising the electromechanical transducer according to claim 12.

17. An electromechanical transducer produced by a process according to claim 2.

18. The electromechanical transducer according to claim 17, wherein at least some of the holes of the second polymer layer having holes have shapes having a non-circular cross-sectional area.

19. The electromechanical transducer according to claim 18, wherein at least some of the holes of the second polymer layer having holes have shapes having a honeycomb structure.

20. One of a sensor, generator and actuator comprising the electromechanical transducer according to claim 17.

21. One of a pressure, force and strain sensor system comprising the electromechanical transducer according to claim 17.

22. One of a loudspeaker, vibration converter, light deflector, membrane, fiber optic modulator, pyroelectric detector, capacitors and control system comprising the electromechanical transducer according to claim 17.

* * * * *